United States Patent
Choi et al.

(10) Patent No.: US 9,678,128 B2
(45) Date of Patent: Jun. 13, 2017

(54) NOISE TEST APPARATUS AND METHOD FOR TESTING A DISPLAY PANEL USING THE SAME

(71) Applicant: Samsung Display Co., LTD., Yongin, Gyeonggi-Do (KR)

(72) Inventors: Ung Choi, Asan-si (KR); Young-Mook Choi, Seoul (KR); Jung-Mi Yun, Daegu (KR); Sang-Rock Yoon, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 79 days.

(21) Appl. No.: 14/502,985

(22) Filed: Sep. 30, 2014

(65) Prior Publication Data
US 2015/0260774 A1 Sep. 17, 2015

(30) Foreign Application Priority Data
Mar. 17, 2014 (KR) .................. 10-2014-0031206

(51) Int. Cl.
*G01R 29/26* (2006.01)
*G01R 29/08* (2006.01)
*H01Q 21/28* (2006.01)

(52) U.S. Cl.
CPC ......... *G01R 29/26* (2013.01); *G01R 29/0814* (2013.01); *G01R 29/0878* (2013.01); *H01Q 21/28* (2013.01)

(58) Field of Classification Search
CPC ............... G01R 31/001; G01R 31/002; G01R 31/31723; G01R 31/3025; G01R 31/2886; G01R 31/2889; G01R 31/311; G01R 31/305; G01R 31/309; G01R 29/026; G01R 7/06; G01R 5/04; G01R 29/0878; G01R 29/26; G01R 29/00814; G01R 1/18; G01R 1/04; G01P 1/06; G01V 1/008; G01S 3/043; G01S 3/046; G01S 3/74; G01S 3/28; G01S 3/46; H04B 17/0037; H04B 17/309; H04B 17/104
USPC .......... 324/613, 555, 443, 144, 750.27, 344, 324/501, 96
See application file for complete search history.

(56) References Cited

U.S. PATENT DOCUMENTS

| | | | |
|---|---|---|---|
| 7,924,232 B2 * | 4/2011 | Kajiwara | G01R 29/0878 343/700 MS |
| 7,937,636 B2 | 5/2011 | Dembo | |
| 2006/0132118 A1 * | 6/2006 | Maekawa | G01R 29/0814 324/96 |

(Continued)

FOREIGN PATENT DOCUMENTS

| | | |
|---|---|---|
| JP | 2001-154650 | 6/2001 |
| KR | 10-2008-0035280 | 4/2008 |

(Continued)

*Primary Examiner* — Thang Le
(74) *Attorney, Agent, or Firm* — Innovation Counsel LLP

(57) ABSTRACT

A noise test apparatus includes a ground plate, a base plate including a ground plate, the ground plate being configured to support a display panel. A first antenna configured to receive electromagnetic waves irradiated by the display panel and disposed on the base plate adjacent to a first side of the ground plate. A second antenna configured to receive the electromagnetic waves irradiated by the display panel and disposed on the base plate adjacent to a second side of the ground plate, the second side extending substantially perpendicular to the first side.

9 Claims, 9 Drawing Sheets

(56) References Cited

U.S. PATENT DOCUMENTS

| | | | | |
|---|---|---|---|---|
| 2007/0024293 | A1* | 2/2007 | Kosaka | G01R 31/001 324/754.21 |
| 2009/0006011 | A1* | 1/2009 | Kazawa | G01R 29/0871 702/57 |
| 2009/0073059 | A1* | 3/2009 | Ikegaya | H01Q 9/42 343/702 |
| 2010/0033191 | A1* | 2/2010 | Lee | G01R 31/001 324/555 |
| 2010/0161525 | A1* | 6/2010 | Gross | G01R 33/10 706/12 |
| 2010/0174497 | A1* | 7/2010 | Masuda | G01B 7/004 702/57 |

FOREIGN PATENT DOCUMENTS

| | | |
|---|---|---|
| KR | 10-2008-0053542 | 6/2008 |
| KR | 10-2008-0053705 | 6/2008 |
| KR | 10-2010-0018940 | 2/2010 |
| KR | 10-2011-0066752 | 6/2011 |
| KR | 10-2011-0070572 | 6/2011 |

* cited by examiner

NOISE TEST APPARATUS AND METHOD FOR TESTING A DISPLAY PANEL USING THE SAME

This application claims priority to Korean Patent Application No. 10-2014-0031206, filed on Mar. 17, 2014, and all the benefits accruing therefrom under 35 U.S.C. §119, the content of which is herein incorporated by reference in its entireties.

BACKGROUND

1. Field

Exemplary embodiments of the inventive concept relate to a noise test apparatus and a method for testing a display panel using the same. More particularly, exemplary embodiments of the inventive concept relate to a noise test apparatus capable of testing an electromagnetic interference ("EMI") noise and a method for testing a display panel using the noise test apparatus.

2. Description of the Related Art

As wireless network communication is becoming more advanced, computers, laptop computers, tablet computers, televisions and the like are increasingly becoming sensitive to electromagnetic interference ("EMI") due to increases in communication frequencies, the number of antennas and the like.

Accordingly, a noise test apparatus, which is used for testing a display panel, EMI, a throughput and the like before finishing a manufacturing process, is necessary. For example, the noise test apparatus may be also used for testing the EMI of a wireless local area network ("WLAN") and the EMI of a wireless wide area network ("WWAN").

A conventional testing jig used for testing the EMI may test an EMI noise of an end product such as laptop computers, tablet PCs, etc including a display panel. No apparatus and method for testing EMI noise of a display panel itself have been developed. Thus, the EMI noise of the display panel may be tested after assembling the display panel into an end product that may delay a detection of the defect in the display panel.

In addition, a structure of the conventional testing jig may not correspond to an inner antenna structure of the end products. Thus, an efficiency of testing an EMI noise of the end products may decrease.

SUMMARY

One or more exemplary embodiment of the inventive concept provides a noise test apparatus capable of testing an EMI noise.

One or more exemplary embodiment of the inventive concept also provides a method for testing a display panel using the noise test apparatus.

According to an exemplary embodiment, a noise test apparatus includes a base plate including a ground plate, a first antenna and a second antenna. The ground plate is configured to support a display panel. The first antenna is configured to receive electromagnetic waves irradiated by the display panel, and disposed on the base plate adjacent to a first side of the ground plate. The second antenna is configured to receive the electromagnetic waves irradiated by the display panel, and disposed on the base plate adjacent to a second side of the ground plate. The second side extends substantially perpendicular to the first side.

In an exemplary embodiment, the first antenna and the second antenna may be disposed on the base plate adjacent to a first corner formed by the first side and the second side of the ground plate.

In an exemplary embodiment, the noise test apparatus may further include a third antenna and a fourth antenna. The third antenna may be configured to receive the electromagnetic waves irradiated by the display panel, and disposed on the base plate adjacent to a third side of the ground plate opposite to the first side of the ground plate. The fourth antenna may be configured to receive the electromagnetic waves irradiated by the display panel, and disposed on the base plate adjacent to the second side of the ground plate.

In an exemplary embodiment, the first antenna and the second antenna may be on the base plate adjacent to a first corner formed by the first side and the second side of the ground plate. The third antenna and the fourth antenna may be on the base plate adjacent to a second corner formed by the second side and the third side of the ground plate.

In an exemplary embodiment, the noise test apparatus may further include a fifth antenna and a sixth antenna. The fifth antenna may be configured to receive the electromagnetic waves irradiated by the display panel, and disposed on the base plate adjacent to a fourth side of the ground plate opposite to the second side of the ground plate. The sixth antenna may be configured to receive the electromagnetic waves irradiated by the display panel, and disposed on the base plate adjacent to the fourth side of the ground plate.

In an exemplary embodiment, the noise test apparatus may further include a seventh antenna, an eighth antenna. The seventh antenna may be configured to receive the electromagnetic waves irradiated by the display panel, and disposed on the base plate adjacent to the first side of the ground plate. The eighth antenna may be configured to receive the electromagnetic waves irradiated by the display panel, and disposed on the base plate adjacent to the third side of the ground plate. The first antenna and the second antenna may be on the base plate adjacent to a first corner formed by the first side and the second side of the ground plate. The third antenna and the fourth antenna may be on the base plate adjacent to a second corner formed by the second side and the third side of the ground plate. The fifth antenna and the seventh antenna may be on the base plate adjacent to a third corner formed by the first side and the fourth side of the ground plate. The sixth antenna and the eighth antenna may be on the base plate adjacent to a fourth corner formed by the third side and the fourth side of the ground plate.

In an exemplary embodiment, the first antenna may be on the base plate adjacent to a center of the first side of the ground plate. The second antenna may be on the base plate adjacent to a first corner formed by the first side and the second side of the ground plate. The third antenna may be on the base plate adjacent to a center of the third side of the ground plate. The fourth antenna may be on the base plate adjacent to a second corner formed by the second side and the third side of the ground plate. The fifth antenna may be on the base plate adjacent to a third corner formed by the first side and the fourth side of the ground plate. The sixth antenna may be on the base plate adjacent to a fourth corner formed by the third side and the fourth side of the ground plate.

In an exemplary embodiment, each of the first antenna and the second antenna may include a circuit board including an antenna pattern.

In an exemplary embodiment, the ground plate may include an insulating material.

According to an exemplary embodiment, a method for testing a display panel includes driving a display panel, receiving electromagnetic waves irradiated by the display panel using a first noise test apparatus comprising a first antenna and a second antenna, where the first antenna is configured to receive the electromagnetic waves irradiated by the display panel along a first direction, and the second antenna is configured to receive the electromagnetic waves irradiated by the display panel along a second direction perpendicular to the first direction, analyzing an electromagnetic interference noise of the display panel based on the electromagnetic waves.

In an exemplary embodiment, the first noise test apparatus may further include a first ground plate configured to support the display panel, the first ground plate including an insulating material. The first antenna may be disposed on the base plate adjacent to a first side of the first ground plate. The second antenna may be disposed on the base plate adjacent to a second side of the first ground plate.

In an exemplary embodiment, the method may further include receiving electromagnetic waves by a second noise test apparatus including a third antenna and a fourth antenna. The third antenna may be configured to receive the electromagnetic waves irradiated by the display panel along a third direction opposite to the first direction. The fourth antenna may be configured to receive the electromagnetic waves irradiated by the display panel along the second direction.

In an exemplary embodiment, the second noise test apparatus may further include a second ground plate configured to support the display panel, the second ground plate including an insulating material. The third antenna may be disposed on the base plate adjacent to a third side of the second ground plate. The fourth antenna may be disposed on the base plate adjacent to a second side of the second ground plate.

In an exemplary embodiment, the first antenna may be on the base plate adjacent to a first corner of the first ground plate, which is formed by the first side and the second side of the first ground plate. The second antenna may be on the base plate adjacent to the first corner of the first ground plate. The third antenna may be on the base plate adjacent to a second corner of the second ground plate, which is formed by the second side and the third side of the second ground plate. The fourth antenna may be on the base plate adjacent to the second corner of the second ground plate.

In an exemplary embodiment, the first noise test apparatus may further include a third antenna and a fourth antenna. The third antenna may be configured to receive the electromagnetic waves irradiated by the display panel along a third direction opposite to the first direction. The fourth antenna may be configured to receive the electromagnetic waves irradiated by the display panel along the second direction. The third antenna may be disposed on the base plate adjacent to a third side of the first ground plate opposite to the first side of the first ground plate. The fourth antenna may be disposed on the base plate adjacent to the second side of the first ground plate.

In an exemplary embodiment, the first antenna may be on the base plate adjacent to a first corner of the first ground plate, which is formed by the first side and the second side of the first ground plate. The second antenna may be on the base plate adjacent to the first corner of the first ground plate. The third antenna may be on the base plate adjacent to a second corner of the first ground plate, which is formed by the second side and the third side of the first ground plate. The fourth antenna may be on the base plate adjacent to the second corner of the first ground plate.

In an exemplary embodiment, the first noise test apparatus may further include a fifth antenna, a sixth antenna, a seventh antenna, and an eighth antenna. The fifth antenna may be configured to receive the electromagnetic waves irradiated by the display panel along a fourth direction opposite to the second direction. The sixth antenna may be configured to receive the electromagnetic waves irradiated by the display panel along the fourth direction. The seventh antenna may be configured to receive the electromagnetic waves irradiated by the display panel along the first direction. The eighth antenna may be configured to receive the electromagnetic waves irradiated by the display panel along the third direction. The fifth antenna may be disposed on the base plate adjacent to a fourth side of the first ground plate opposite to the second side of the first ground plate, the fifth antenna being disposed on the base plate adjacent to a third corner of the first ground plate, which is formed by the first side and the fourth side of the first ground plate. The sixth antenna may be disposed on the base plate adjacent to the fourth side of the first ground plate, the sixth antenna being disposed on the base plate adjacent to a fourth corner of the first ground plate, which is formed by the third side and the fourth side of the first ground plate. The seventh antenna may be disposed on the base plate adjacent to the first side of the first ground plate, the seventh antenna being on the base plate adjacent to the third corner of the first ground plate. The eighth antenna may be disposed on the base plate adjacent to the third side of the first ground plate, the eighth antenna being on the base plate adjacent to the fourth corner of the first ground plate.

In an exemplary embodiment, the first noise test apparatus may further include a fifth antenna and a sixth antenna. The fifth antenna may be configured to receive the electromagnetic waves irradiated by the display panel along a fourth direction opposite to the second direction. The sixth antenna may be configured to receive the electromagnetic waves irradiated by the display panel along the fourth direction. The fifth antenna and the sixth antenna may be disposed adjacent to a fourth side of the first ground plate. The first antenna may be adjacent to a center of the first side of the first ground plate. The third antenna may be adjacent to a center of the third side of the first ground plate.

In an exemplary embodiment, the display panel may include a display part configured to display an image and a wireless network device. The driving the display panel may include driving the display part and driving the wireless network device.

In an exemplary embodiment, the wireless network device may be parallel with and adjacent to a first side of the display panel.

According to one or more exemplary embodiment of the noise test apparatus and the method for testing a display panel using the noise test apparatus, an EMI noise of wireless network system may be tested before the display panel is assembled into an end product. Defect such as the EMI noise of wireless network system may be recognized at an early stage of manufacturing the end product.

BRIEF DESCRIPTION OF THE DRAWINGS

The above and other features and advantages of the inventive concept will become more apparent by describing in detailed exemplary embodiments thereof with reference to the accompanying drawings, in which.

DETAILED DESCRIPTION

Hereinafter, the inventive concept will be explained in detail with reference to the accompanying drawings.

Figure 1:
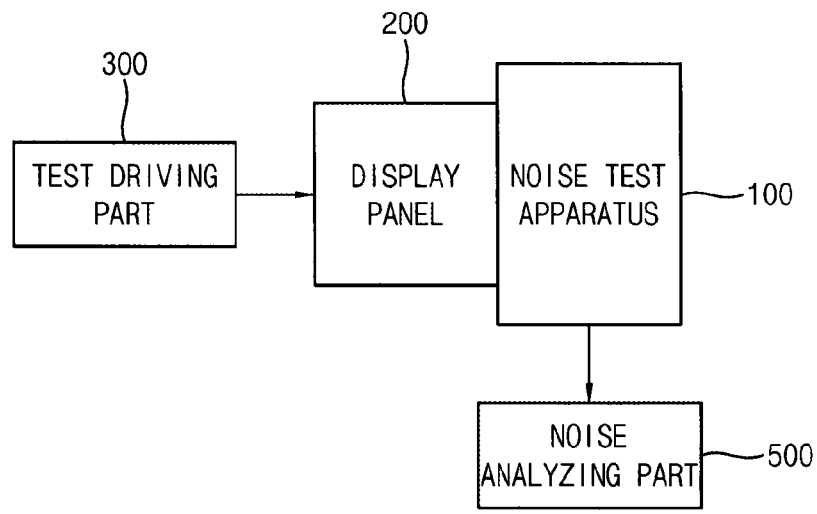
FIG. 1 is a block diagram illustrating a panel test system including a noise test apparatus according to an exemplary embodiment of the inventive concept.

FIG. 1 is a block diagram illustrating a panel testing system including a noise test apparatus according to an exemplary embodiment of the inventive concept.

Referring to FIG. 1, the panel test system includes a noise test apparatus 100, a test driving part 300 and a noise analyzing part 500.

The noise test apparatus 100 may receive electromagnetic waves irradiated by a target device such as a display panel 200. The target device may be disposed on the noise test apparatus 100. The noise test apparatus 100 may include a ground plate and at least one antenna. The ground plate may include an insulating material. The antennas may receive the electromagnetic waves irradiated by the target device. Hereinafter, the display panel 200 is referred to as the target device for convenience of explanation.

The antennas may receive the electromagnetic waves irradiated by the display panel 200. Each of the antennas may include a circuit board type antenna which includes an antenna pattern formed on a circuit board. Alternatively, each of the antennas may be a conventional antenna which may receive electromagnetic waves.

The antennas may be preset to sense the electromagnetic waves having frequency in a range of about 740 MHz, 910 MHz, and 1940 MHz. For example, the antennas may be preset to sense the electromagnetic waves having a frequency between about 690 MHz and about 790 MHz. Alternatively, the antennas may be preset to sense the electromagnetic waves having a frequency about 860 MHz and about 960 MHz. Alternatively, the antennas may be preset to sense the electromagnetic waves having a frequency about 1890 MHz and about 1990 MHz.

The antennas may output the received electromagnetic waves to the noise analyzing part 500.

Examples of the display panel 200 may include a liquid crystal display ("LCD") panel, a plasma display panel ("PDP"), and an organic light-emitting diode ("OLED") panel. The display panel 200 may be a panel before assembled into a complete display apparatus, for example, TV, note PC, Tablet PC, etc.

The display panel 200 may include a display part displaying an image and a wireless network device irradiating the electromagnetic waves. The wireless network device may include a wireless local area network ("WLAN") and/or a wireless wide area network ("WWAN"). The wireless network device may be disposed in parallel with and adjacent to a first side of the display panel 200.

The display panel 200 may be a display panel of a tablet display apparatus, but not limited thereto or thereby. The display panel 200 may include a display panel of a computer monitor, a laptop computer, a table PC and a television.

The display panel 200 may be disposed on the noise test apparatus 100. The display part of the display panel 200 may face the ground plate of the noise test apparatus 100. Alternatively, a rear surface opposite to the display part may face the ground plate of the noise test apparatus 100.

The test driving part 300 may drive the display panel 200. For example, the test driving part 300 may drive the display part and the wireless network device of the display panel 200. When the test driving part 300 drives the display panel 200, the display panel 200 displays an image and irradiates the electromagnetic waves.

The noise analyzing part 500 receives the electromagnetic waves from the antennas in the display panel 200. A noise analyzer in the noise analyzing part 500 may analyze the noise from the display panel 200 and output an evaluation data, based on the electromagnetic waves received from the antennas. The evaluation data may include an EMI noise generated by the wireless network device. The noise analyzing part 500 may analyze the EMI noise generated by the wireless network device of the display panel 200, based on the electromagnetic waves received from the antennas.

The noise analyzing part 500 may further include a spectrum analyzer. The spectrum analyzer may analyze a spectrum of the electromagnetic waves received from the antennas, and output an analyzed spectrum. The noise analyzing part 500 may receive the spectrum from the spectrum analyzer and output the evaluation data.

A method for testing the display panel 200 using the panel test system may include a step of driving the display panel 200 to irradiate the electromagnetic waves by using the test driving part 300, a step of receiving the electromagnetic waves by using the noise test apparatus 100, and a step of analyzing the noise of the display panel 200 based on the electromagnetic waves. The step of driving the display panel 200 may include a step of driving the display part of the display panel 200 and a step of driving the wireless network device of the display panel 200.

The noise test apparatus 100 may include a first noise test apparatus and a second noise test apparatus. The first noise test apparatus and the second noise test apparatus are explained in detail referring to FIGS. 2 to 7.

Figure 2:
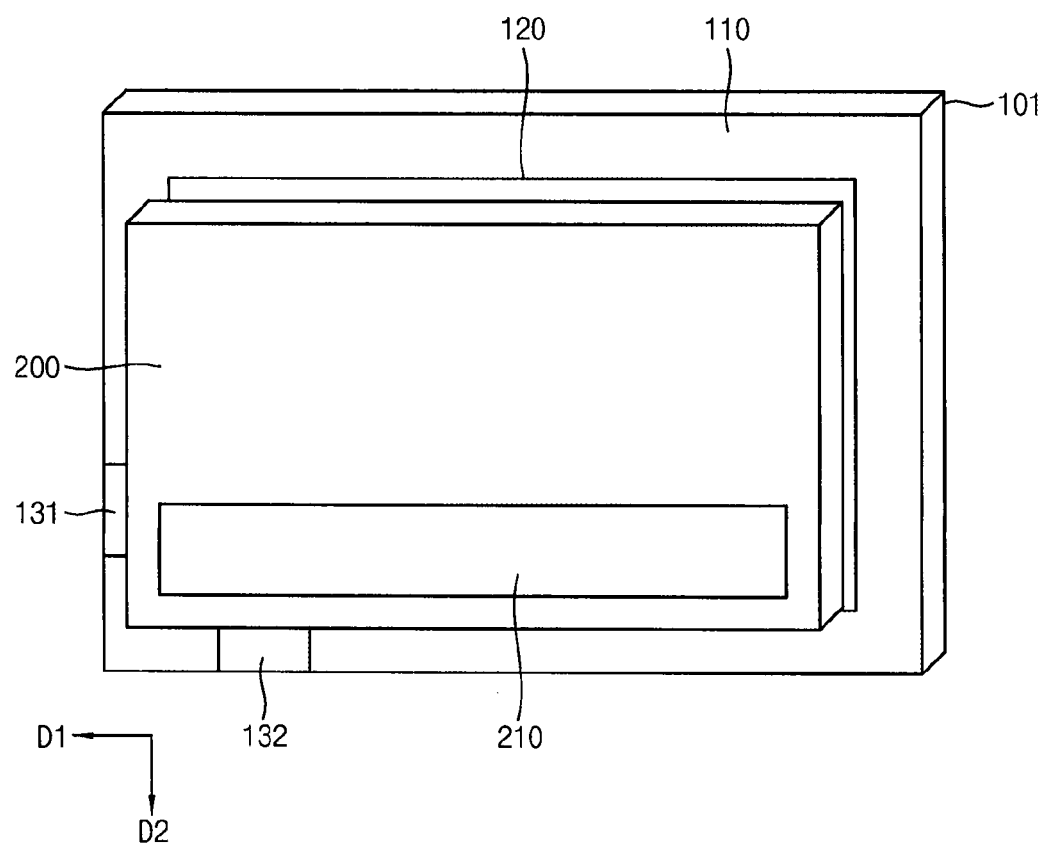
FIG. 2 is a perspective view illustrating a first noise test apparatus and a display panel of FIG. 1.
Figure 3:
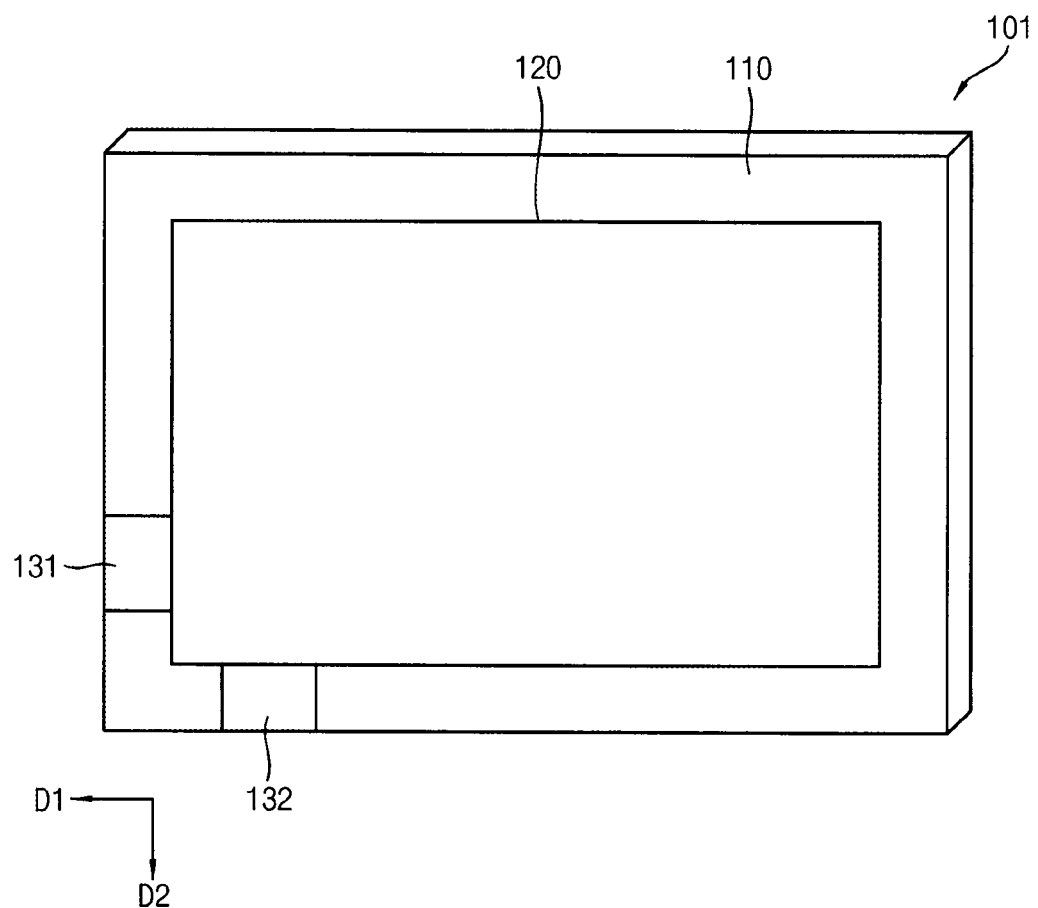
FIG. 3 is a perspective view illustrating the first noise test apparatus of FIG. 2.
Figure 4:
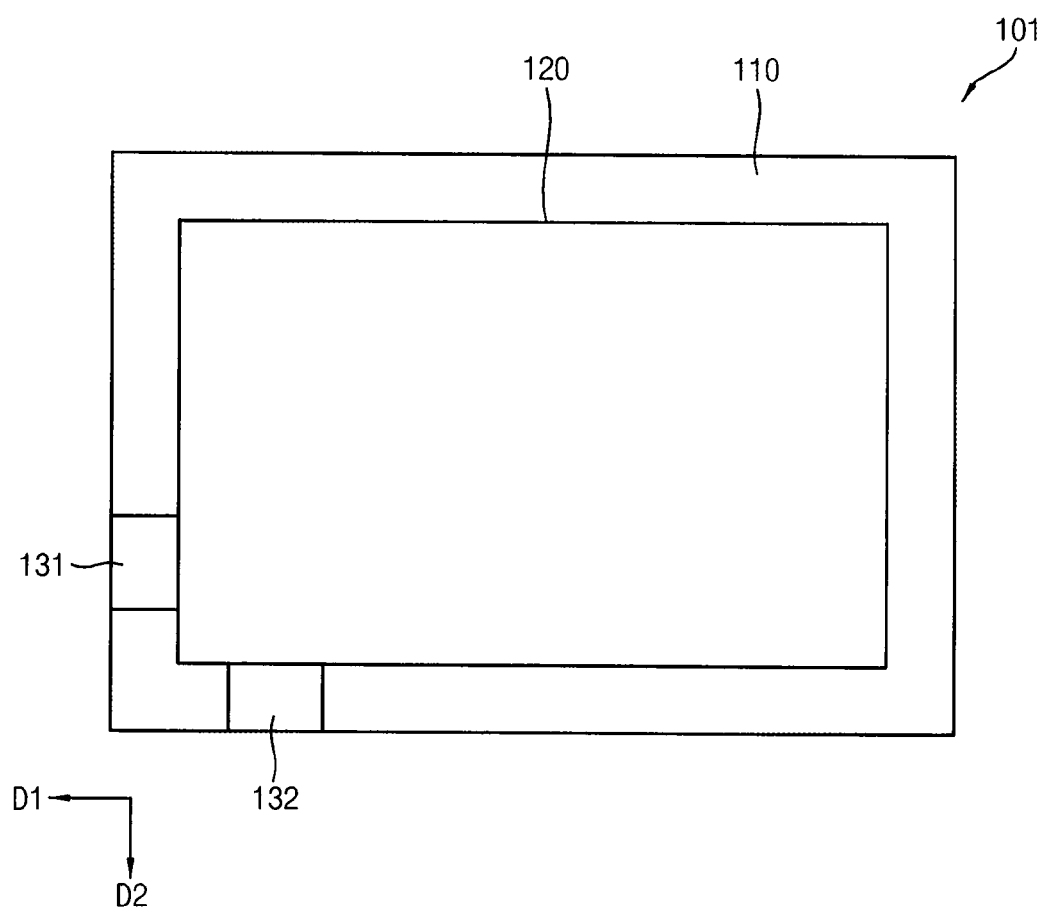
FIG. 4 is a plan view illustrating the first noise test apparatus of FIG. 2.
Figure 5:
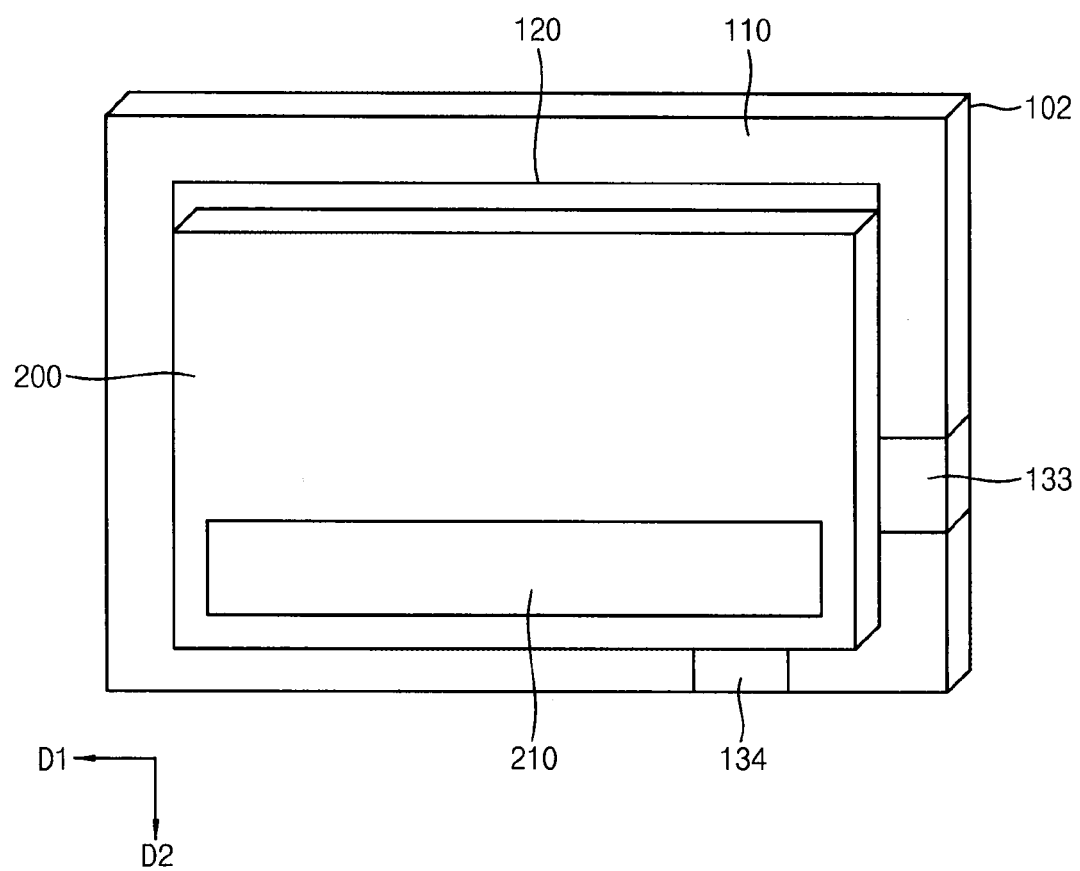
FIG. 5 is a perspective view illustrating a second noise test apparatus and a display panel of FIG. 1.
Figure 6:
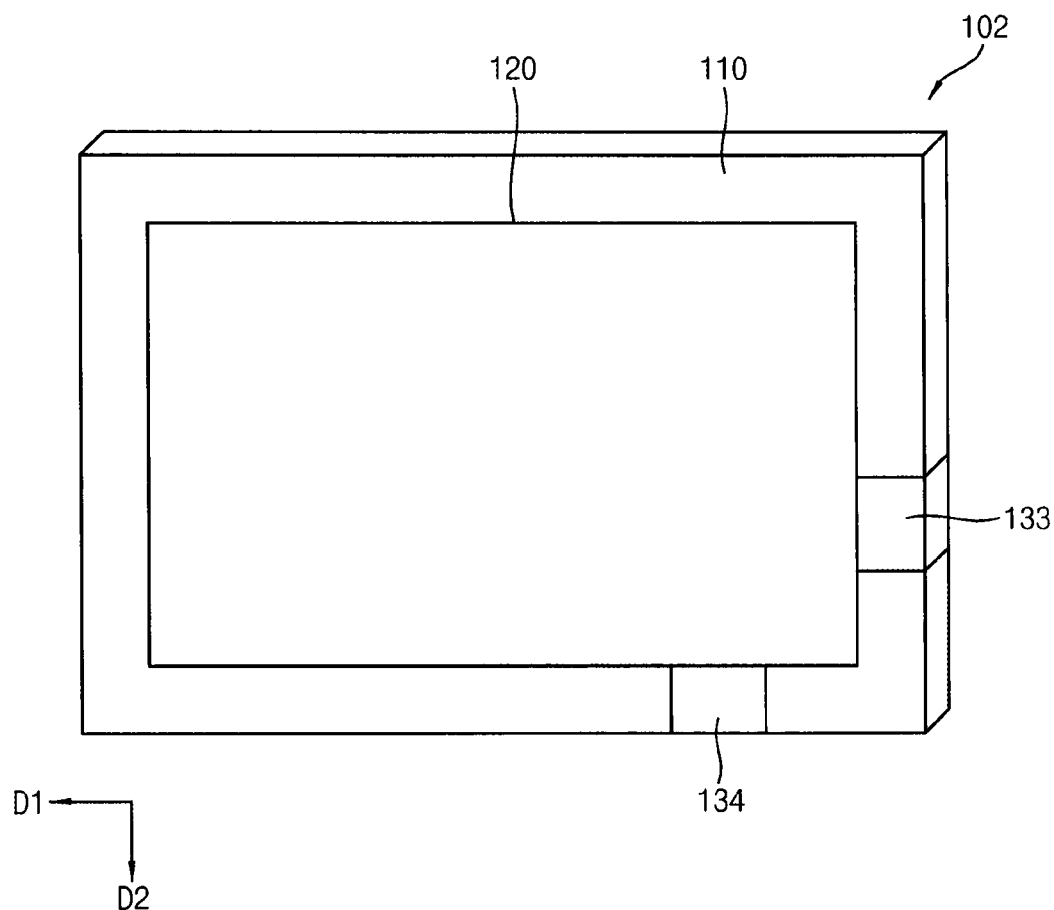
FIG. 6 is a perspective view illustrating the second noise test apparatus of FIG. 5.
Figure 7:
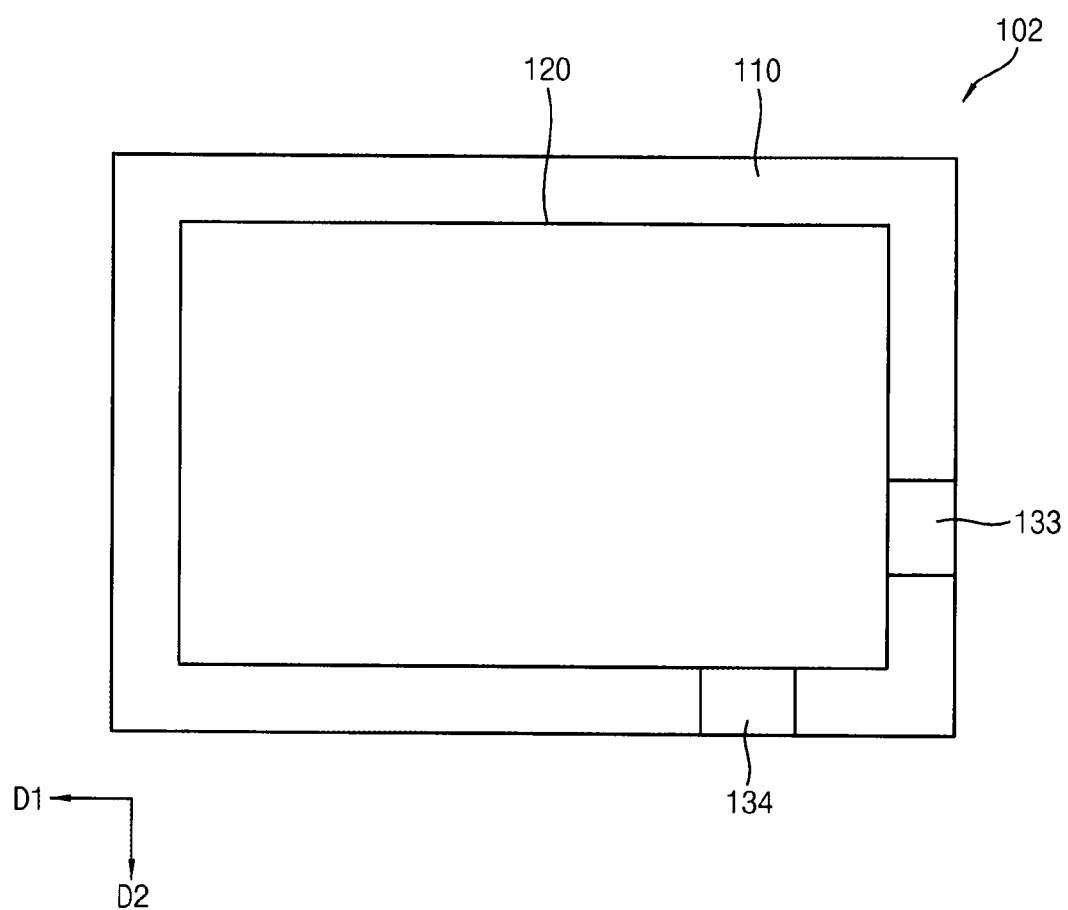
FIG. 7 is a plan view illustrating the second noise test apparatus of FIG. 5.

FIG. 2 is a perspective view illustrating a first noise test apparatus and a display panel of FIG. 1. FIG. 3 is a perspective view illustrating the first noise test apparatus of FIG. 2. FIG. 4 is a plan view illustrating the first noise test apparatus of FIG. 2. FIG. 5 is a perspective view illustrating a second noise test apparatus and a display panel of FIG. 1. FIG. 6 is a perspective view illustrating the second noise test apparatus of FIG. 5. FIG. 7 is a plan view illustrating the second noise test apparatus of FIG. 5.

Referring to FIGS. 1 to 7, the noise test apparatus may include a first noise test apparatus 101 and a second noise test apparatus 102.

A method for testing the display panel 200 using the panel test system may include a step of driving the display panel 200 to irradiate the electromagnetic waves by using the test driving part 300, a step of receiving the electromagnetic waves by using the first noise test apparatus 101, a step of receiving the electromagnetic waves by using the second noise test apparatus 102, and a step of analyzing the noise of the display panel 200 based on the electromagnetic waves received from the first and second noise test apparatuses 101 and 102. The step of driving the display panel 200 may include a step of driving the display part of the display panel 200 and a step of driving the wireless network device of the display panel 200.

An order of the steps of receiving the electromagnetic waves by using the first and second noise test apparatuses 101 and 102 may be performed in reverse order. For example, the step of receiving the electromagnetic waves by using the first noise test apparatus 101 may be performed prior to the step of receiving the electromagnetic waves by using the second noise test apparatus 102. Alternatively, the step of receiving the electromagnetic waves by using the second noise test apparatus 102 may be performed prior to the step of receiving the electromagnetic waves by using the first noise test apparatus 101.

Referring to FIGS. 1 to 4, the first noise test apparatus 101 may include a base substrate 110, a first antenna 131 and a second antenna 132.

The base substrate 110 may have a substantially rectangular shape. Alternatively, the base substrate 110 may have a substantially circular shape, a triangular shape, a polygonal shape and the like according to the shape of the display panel 200. The base substrate 110 may include an insulating material which is not effective to the electromagnetic waves. For example, the base substrate 110 may include rubber, reinforced plastic or a circuit board which does not include a circuit pattern.

The base substrate 110 may include a ground plate 120. The ground plate 120 may be disposed on the base substrate 110. The base substrate 110 includes an upper surface and a lower surface. The display panel 200 may be disposed on the upper surface of the base substrate 110. For example, the ground plate 120 may be disposed on the lower surface of the base substrate 110. Alternatively, the ground plate 120 may be disposed on the upper surface of the base substrate 110. Alternatively, the ground plate 120 may be enclosed in the base substrate 110.

The ground plate 120 may support the display panel 200. The ground plate 120 may include an insulating material. For example, the ground plate 120 may include an insulating material the same as the insulating material of the base substrate 110.

A size of the ground plate 120 may be less than a size of the base substrate 110. Thus, edges of the ground plate 120 may be spaced apart from edges of the base substrate 110 by a uniform distance.

The size of the ground plate 120 may be greater than or equal to a size of the display panel 200. The display panel 200 may overlap the ground plate 120. For example, the display part of the display panel 200 may face the ground plate 120. Alternatively, the rear surface of the display part may face the ground plate 120.

The ground plate 120 includes a first side, a second side, a third side and a fourth side respectively corresponding to the first direction D1, a second direction D2 perpendicular to the first direction D1, a third direction opposite to the first direction D1 and a fourth direction opposite to the second direction D2.

The first antenna 131 may receive the electromagnetic waves irradiated by the display panel 200. For example, the first antenna 131 may receive the electromagnetic waves irradiated by the display panel 200 along the first direction D1.

The first antenna 131 may be disposed adjacent to the first side of the ground plate 120. The ground plate 120 includes a first corner formed by the first side and the second side. The first antenna 131 may be adjacent to the first corner of the ground plate 120.

The first antenna 131 may include a circuit board type antenna which includes an antenna pattern formed on a circuit board. Thus, the first antenna 131 may be mounted on the base substrate 110 adjacent to the first side of the ground plate 120.

The second antenna 132 may receive the electromagnetic waves irradiated by the display panel 200. For example, the second antenna 132 may receive the electromagnetic waves irradiated by the display panel 200 along the second direction D2.

The second antenna 132 may be disposed adjacent to the second side of the ground plate 120. The second antenna 132 may be adjacent to the first corner of the ground plate 120.

The second antenna 132 may include the circuit board type antenna. Thus, the second antenna 132 may be mounted on the base substrate 110 adjacent to the second side of the ground plate 120.

The display panel 200 may include the wireless network device 210. The wireless network device 210 may be disposed in parallel with and adjacent to a first side of the display panel 200. For example, the wireless network device 210 may be disposed on the rear surface of the display panel 200 adjacent to the first side of the display panel 200.

The display panel 200 may be disposed on the first noise test apparatus 101. The display part of the display panel 200 may face the ground plate 120, and the first side of the display panel 200 may face the second direction D2. Thus, the first antenna 131 and the second antenna 132 may be positioned adjacent to the wireless network device 210 in the first and second directions D1 and D2.

The second noise test apparatus 102 according to the illustrated exemplary embodiment is substantially the same as the first noise test apparatus 101 in FIGS. 2 to 4 except that the second noise test apparatus 102 includes a third antenna 133 and a fourth antenna 134 instead of the first antenna 131 and the second antenna 132. Thus, the same reference numerals will be used to refer to same or like parts as those described in with reference to FIGS. 2 to 4 and any further repetitive explanation concerning the above elements will be omitted.

Referring to FIGS. 1 and 5 to 7, the second noise test apparatus 102 may include a base substrate 110, a third antenna 133 and a fourth antenna 134.

The base substrate 110 may include a ground plate 120. The ground plate 120 may support the display panel 200. The ground plate 120 may include an insulating material. For example, the ground plate 120 may include an insulating material the same as the insulating material of the base substrate 110.

The ground plate 120 includes a first side, a second side, a third side and a fourth side respectively corresponding to the first direction D1, the second direction D2, the third direction and the fourth direction.

The third antenna 133 may receive the electromagnetic waves irradiated by the display panel 200. For example, the third antenna 133 may receive the electromagnetic waves irradiated by the display panel 200 along the third direction.

The third antenna 133 may be disposed adjacent to the third side of the ground plate 120. The ground plate 120 includes a second corner formed by the second side and the third side. The third antenna 133 may be adjacent to the second corner of the ground plate 120.

The third antenna 133 may include a circuit board type antenna which includes an antenna pattern formed on a circuit board. Thus, the third antenna 133 may be mounted on the base substrate 110 adjacent to the third side of the ground plate 120.

The fourth antenna 134 may receive the electromagnetic waves irradiated by the display panel 200. For example, the fourth antenna 134 may receive the electromagnetic waves irradiated by the display panel 200 along the second direction D2.

The fourth antenna 134 may be disposed adjacent to the second side of the ground plate 120. The fourth antenna 134 may be adjacent to the second corner of the ground plate 120.

The fourth antenna 134 may include the circuit board type antenna. Thus, the fourth antenna 134 may be mounted on the base substrate 110 adjacent to the second side of the ground plate 120.

The display panel 200 may be disposed on the second noise test apparatus 102. The display part of the display panel 200 may face the ground plate 120, and the first side of the display panel 200 may face the second direction D2. Thus, the third antenna 133 and the fourth antenna 134 may be positioned adjacent to the wireless network device 210 in the third direction and the second direction D2.

In this exemplary embodiment, the panel test system may include the first noise test apparatus 101 and the second noise test apparatus 102. The first noise test apparatus 101 may include the first and second antennas 131 and 132 adjacent to the wireless network device 210 of display panel 200 which generates a noise. The second noise test apparatus 102 may include the third and fourth antennas 133 and 134 adjacent to the wireless network device 210.

The first noise test apparatus 101 may receive the electromagnetic waves irradiated by the display panel 200. The second noise test apparatus 102 may receive the electromagnetic waves irradiated by the display panel 200. Thus, the panel test system may analyze the noise of the display panel 200 based on the electromagnetic waves received by the first and second noise test apparatus 101 and 102.

Figure 8:
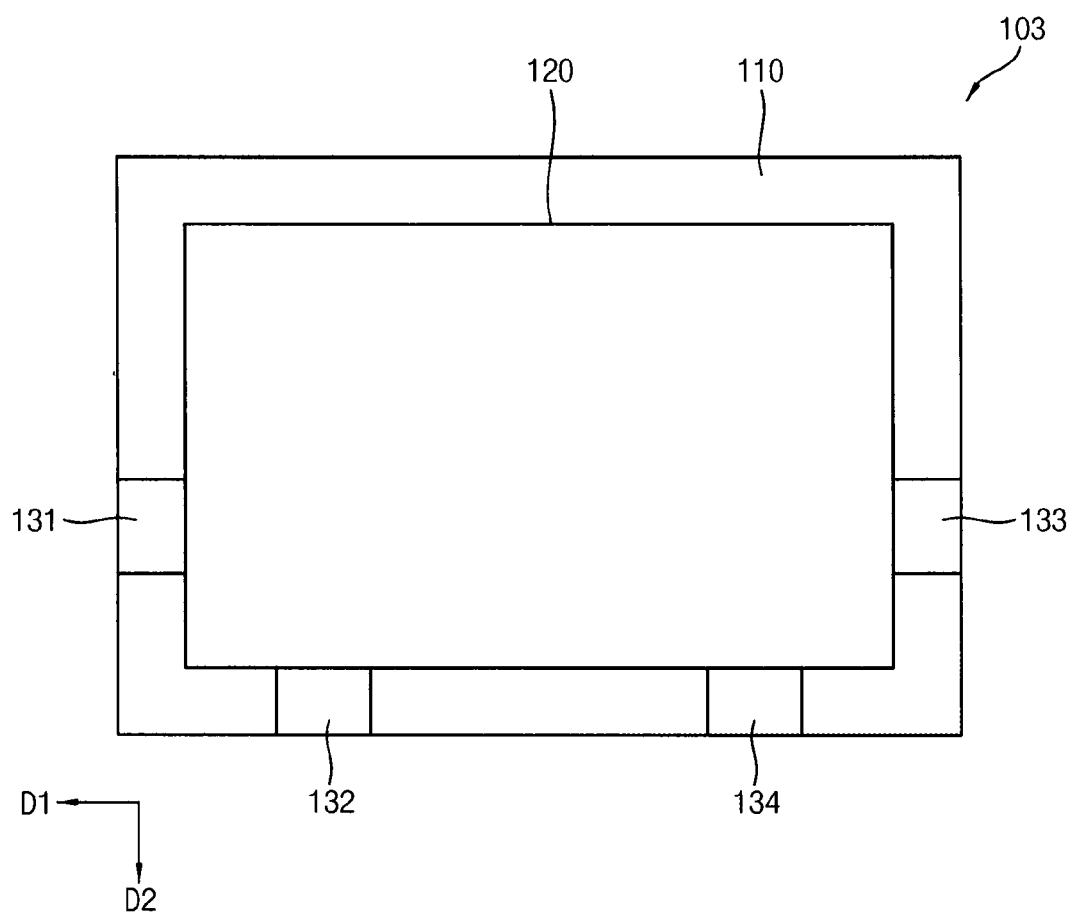
FIG. 8 is a plan view illustrating a noise test apparatus according to an exemplary embodiment of the inventive concept.

FIG. 8 is a plan view illustrating a noise test apparatus according to an exemplary embodiment of the inventive concept.

A third noise test apparatus 103 according to the illustrated exemplary embodiment is substantially the same as the first noise test apparatus 101 in FIGS. 2 to 4 except that the third noise test apparatus 103 further includes a third antenna 133 and a fourth antenna 134. Thus, the same reference numerals will be used to refer to same or like parts as those described in with reference to FIGS. 2 to 4 and any further repetitive explanation concerning the above elements will be omitted.

Referring to FIGS. 1 and 8, the noise test apparatus 100 may include a third noise test apparatus 103.

A method for testing the display panel 200 using the panel test system may include a step of driving the display panel 200 to irradiate the electromagnetic waves by using the test driving part 300, a step of receiving the electromagnetic waves by using the third noise test apparatus 103, and a step of analyzing the noise of the display panel 200 based on the electromagnetic waves received from the third noise test apparatuses 103. The step of driving the display panel 200 may include a step of driving the display part of the display panel 200 and a step of driving the wireless network device of the display panel 200.

The third noise test apparatus 103 may include a base substrate 110, a first antenna 131, a second antenna 132, third antenna 133 and a fourth antenna 134.

The base substrate 110 may include a ground plate 120.

The ground plate 120 may support the display panel 200. The ground plate 120 may include an insulating material. For example, the ground plate 120 may include an insulating material the same as the insulating material of the base substrate 110.

The ground plate 120 includes a first side, a second side, a third side and a fourth side respectively corresponding to the first direction D1, the second direction D2, the third direction and the fourth direction.

The first antenna 131 may receive the electromagnetic waves irradiated by the display panel 200. For example, the first antenna 131 may receive the electromagnetic waves irradiated by the display panel 200 along the first direction D1.

The first antenna 131 may be disposed adjacent to the first side of the ground plate 120. The ground plate 120 includes a first corner formed by the first side and the second side. The first antenna 131 may be adjacent to the first corner of the ground plate 120.

The first antenna 131 may include a circuit board type antenna which includes an antenna pattern formed on a circuit board. Thus, the first antenna 131 may be mounted on the base substrate 110 adjacent to the first side of the ground plate 120.

The second antenna 132 may receive the electromagnetic waves irradiated by the display panel 200. For example, the second antenna 132 may receive the electromagnetic waves irradiated by the display panel 200 along the second direction D2.

The second antenna 132 may be disposed adjacent to the second side of the ground plate 120. The second antenna 132 may be adjacent to the first corner of the ground plate 120.

The second antenna 132 may include the circuit board type antenna. Thus, the second antenna 132 may be mounted on the base substrate 110 adjacent to the second side of the ground plate 120.

The third antenna 133 may receive the electromagnetic waves irradiated by the display panel 200. For example, the third antenna 133 may receive the electromagnetic waves irradiated by the display panel 200 along the third direction.

The third antenna 133 may be disposed adjacent to the third side of the ground plate 120. The ground plate 120 includes a second corner formed by the second side and the third side. The third antenna 133 may be adjacent to the second corner of the ground plate 120.

The third antenna 133 may include the circuit board type antenna. Thus, the third antenna 133 may be mounted on the base substrate 110 adjacent to the third side of the ground plate 120.

The fourth antenna 134 may receive the electromagnetic waves irradiated by the display panel 200. For example, the fourth antenna 134 may receive the electromagnetic waves irradiated by the display panel 200 along the second direction D2.

The fourth antenna 134 may be disposed adjacent to the second side of the ground plate 120. The fourth antenna 134 may be adjacent to the second corner of the ground plate 120.

The fourth antenna 134 may include the circuit board type antenna. Thus, the fourth antenna 134 may be mounted on the base substrate 110 adjacent to the second side of the ground plate 120.

The display panel 200 may include the wireless network device. The wireless network device may be disposed in parallel with and adjacent to a first side of the display panel 200. For example, the wireless network device may be disposed on the rear surface of the display panel 200 adjacent to the first side of the display panel 200. The display panel 200 may further include the wireless network device which is in parallel with and adjacent to a second side of the display panel 200. The second side of the display panel 200 may be perpendicular to the first side of the display panel 200.

The display panel 200 may be disposed on the third noise test apparatus 103. The display part of the display panel 200 may face the ground plate 120, and the first side of the display panel 200 may face the second direction D2. Thus, the first antenna 131 and the second antenna 132 may be positioned adjacent to the wireless network device in the first and second directions D1 and D2. The third antenna 133 and the fourth antenna 134 may be positioned adjacent to the wireless network device in the third direction and the second direction D2 respectively.

In this exemplary embodiment, the panel test system may include the third noise test apparatus 103. The third noise test apparatus 103 may include the first, second, third and fourth antennas 131, 132, 133 and 134 adjacent to the wireless network device of display panel 200 which generates a noise.

The third noise test apparatus 103 may receive the electromagnetic waves irradiated by the display panel 200. Thus, the panel test system may analyze the noise of the display panel 200 based on the electromagnetic waves received by the third noise test apparatus 103.

Figure 9:
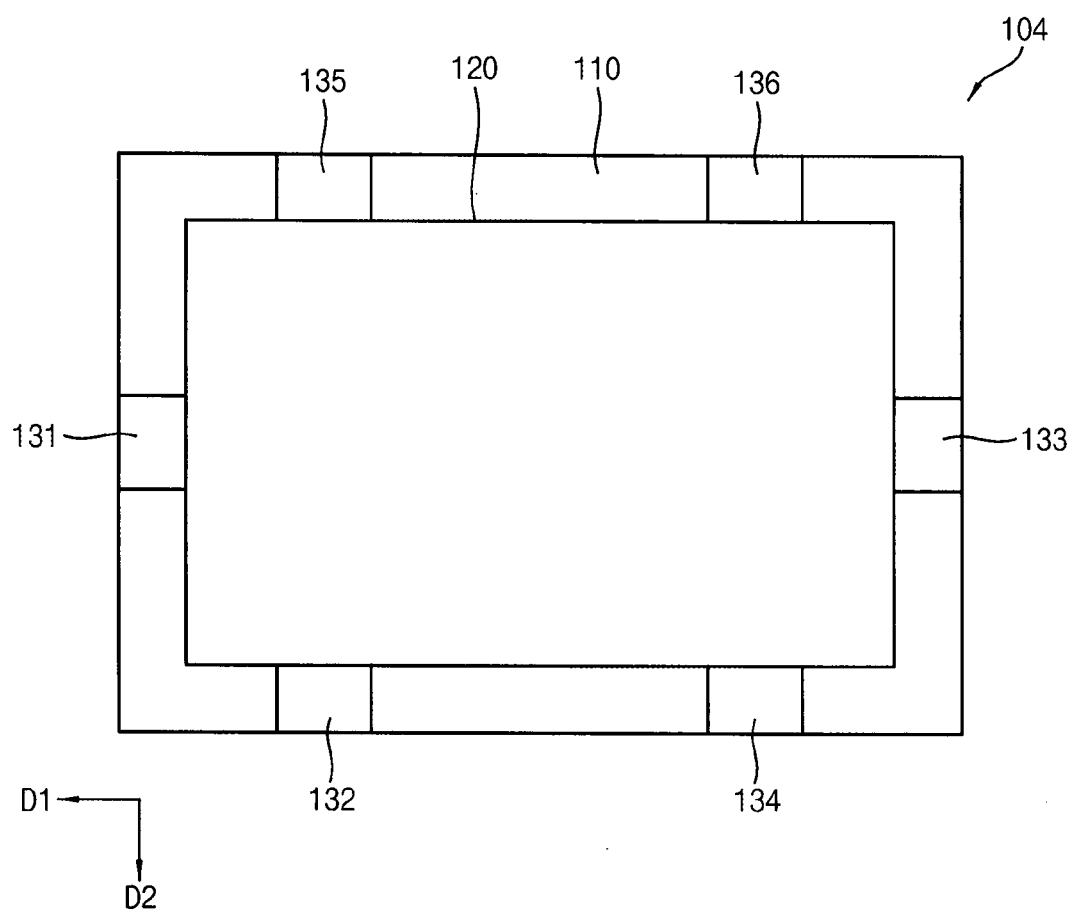
FIG. 9 is a plan view illustrating a noise test apparatus according to an exemplary embodiment of the inventive concept.

FIG. 9 is a plan view illustrating a noise test apparatus according to an exemplary embodiment of the inventive concept.

A fourth noise test apparatus 104 according to the illustrated exemplary embodiment is substantially the same as the third noise test apparatus 103 in FIG. 8 except that the third noise test apparatus 104 further includes a fifth antenna 135 and a sixth antenna 136, and positions of the first antenna 131 and the third antenna 133 are different. Thus, the same reference numerals will be used to refer to same or like parts as those described in with reference to FIG. 8 and any further repetitive explanation concerning the above elements will be omitted.

Referring to FIGS. 1 and 9, the noise test apparatus 100 may include the fourth noise test apparatus 104.

A method for testing the display panel 200 using the panel test system may include a step of driving the display panel 200 to irradiate the electromagnetic waves by using the test driving part 300, a step of receiving the electromagnetic waves by using the fourth noise test apparatus 104, and a step of analyzing the noise of the display panel 200 based on the electromagnetic waves received from the fourth noise test apparatuses 104. The step of driving the display panel 200 may include a step of driving the display part of the display panel 200 and a step of driving the wireless network device of the display panel 200.

The fourth noise test apparatus 104 may include a base substrate 110, a first antenna 131, a second antenna 132, a third antenna 133, a fourth antenna 134, a fifth antenna 135 and a sixth antenna 136.

The base substrate 110 may include a ground plate 120.
The ground plate 120 may support the display panel 200.
The ground plate 120 may include an insulating material.

For example, the ground plate 120 may include an insulating material the same as the insulating material of the base substrate 110.

The ground plate 120 includes a first side, a second side, a third side and a fourth side respectively corresponding to the first direction D1, the second direction D2, the third direction and the fourth direction.

The first antenna 131 may receive the electromagnetic waves irradiated by the display panel 200. For example, the first antenna 131 may receive the electromagnetic waves irradiated by the display panel 200 along the first direction D1.

The first antenna 131 may be disposed adjacent to the first side of the ground plate 120. The first antenna 131 may be adjacent to a center of the first side of the ground plate 120.

The first antenna 131 may include a circuit board type antenna which includes an antenna pattern formed on a circuit board. Thus, the first antenna 131 may be mounted on the base substrate 110 adjacent to the first side of the ground plate 120.

The second antenna 132 may receive the electromagnetic waves irradiated by the display panel 200. For example, the second antenna 132 may receive the electromagnetic waves irradiated by the display panel 200 along the second direction D2.

The second antenna 132 may be disposed adjacent to the second side of the ground plate 120. The ground plate 120 includes a first corner formed by the first side and the second side. The second antenna 132 may be adjacent to the first corner of the ground plate 120.

The second antenna 132 may include the circuit board type antenna. Thus, the second antenna 132 may be mounted on the base substrate 110 adjacent to the second side of the ground plate 120.

The third antenna 133 may receive the electromagnetic waves irradiated by the display panel 200. For example, the third antenna 133 may receive the electromagnetic waves irradiated by the display panel 200 along the third direction.

The third antenna 133 may be disposed adjacent to the third side of the ground plate 120. The third antenna 133 may be adjacent to a center of the third side of the ground plate 120.

The third antenna 133 may include the circuit board type antenna. Thus, the third antenna 133 may be mounted on the base substrate 110 adjacent to the third side of the ground plate 120.

The fourth antenna 134 may receive the electromagnetic waves irradiated by the display panel 200. For example, the fourth antenna 134 may receive the electromagnetic waves irradiated by the display panel 200 along the second direction D2.

The fourth antenna 134 may be disposed adjacent to the second side of the ground plate 120. The ground plate 120 includes a second corner formed by the second side and the third side. The fourth antenna 134 may be adjacent to the second corner of the ground plate 120.

The fourth antenna 134 may include the circuit board type antenna. Thus, the fourth antenna 134 may be mounted on the base substrate 110 adjacent to the second side of the ground plate 120.

The fifth antenna 135 may receive the electromagnetic waves irradiated by the display panel 200. For example, the fifth antenna 135 may receive the electromagnetic waves irradiated by the display panel 200 along the fourth direction.

The fifth antenna 135 may be disposed adjacent to the fourth side of the ground plate 120. The ground plate 120 includes a third corner formed by the first side and the fourth side. The fifth antenna 135 may be adjacent to the third corner of the ground plate 120.

The fifth antenna 135 may include the circuit board type antenna. Thus, the fifth antenna 135 may be mounted on the base substrate 110 adjacent to the fourth side of the ground plate 120.

The sixth antenna 136 may receive the electromagnetic waves irradiated by the display panel 200. For example, the sixth antenna 136 may receive the electromagnetic waves irradiated by the display panel 200 along the fourth direction.

The sixth antenna 136 may be disposed adjacent to the fourth side of the ground plate 120. The ground plate 120 includes a fourth corner formed by the third side and the fourth side. The sixth antenna 136 may be adjacent to the fourth corner of the ground plate 120.

The sixth antenna 136 may include the circuit board type antenna. Thus, the sixth antenna 136 may be mounted on the base substrate 110 adjacent to the fourth side of the ground plate 120.

The display panel 200 may be disposed on the fourth noise test apparatus 104. The display part of the display panel 200 may face the ground plate 120, and the first side of the display panel 200 may face the second direction D2.

In this exemplary embodiment, the panel test system may include the fourth noise test apparatus 104. The fourth noise test apparatus 104 may include the first to sixth antennas 131 to 136 adjacent to the wireless network device of display panel 200 which generates a noise.

The fourth noise test apparatus 104 may receive the electromagnetic waves irradiated by the display panel 200. Thus, the panel test system may analyze the noise of the display panel 200 based on the electromagnetic waves received by the fourth noise test apparatus 104.

Figure 10:
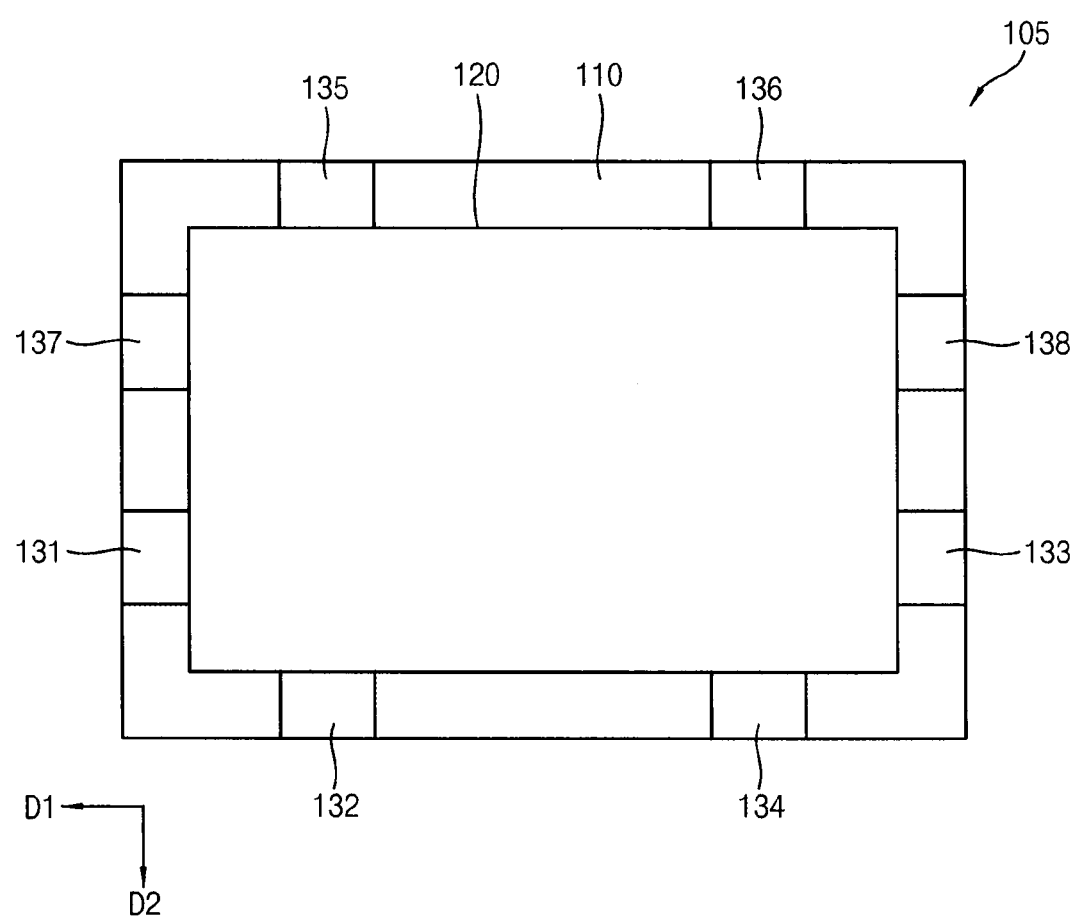
FIG. 10 is a plan view illustrating a noise test apparatus according to an exemplary embodiment of the inventive concept.

FIG. 10 is a plan view illustrating a noise test apparatus according to an exemplary embodiment of the inventive concept.

A fifth noise test apparatus 105 according to the illustrated exemplary embodiment is substantially the same as the third noise test apparatus 103 in FIG. 8 except that the fifth noise test apparatus 105 further includes a fifth antenna 135, a sixth antenna 136, a seventh antenna 137 and an eighth antenna 138. Thus, the same reference numerals will be used to refer to same or like parts as those described in with reference to FIG. 8 and any further repetitive explanation concerning the above elements will be omitted.

Referring to FIGS. 1 and 10, the noise test apparatus 100 may include a fifth noise test apparatus 105.

A method for testing the display panel 200 using the panel test system may include a step of driving the display panel 200 to irradiate the electromagnetic waves by using the test driving part 300, a step of receiving the electromagnetic waves by using the fifth noise test apparatus 105, and a step of analyzing the noise of the display panel 200 based on the electromagnetic waves received from the fifth noise test apparatuses 105. The step of driving the display panel 200 may include a step of driving the display part of the display panel 200 and a step of driving the wireless network device of the display panel 200.

The fifth noise test apparatus 105 may include a base substrate 110, a first antenna 131, a second antenna 132, a third antenna 133, a fourth antenna 134, a fifth antenna 135, a sixth antenna 136, a seventh antenna 137 and eighth antenna 138.

The base substrate 110 may include a ground plate 120.

The ground plate 120 may support the display panel 200. The ground plate 120 may include an insulating material. For example, the ground plate 120 may include an insulating material the same as the insulating material of the base substrate 110.

The ground plate 120 includes a first side, a second side, a third side and a fourth side respectively corresponding to the first direction D1, the second direction D2, the third direction and the fourth direction.

The first antenna 131 may receive the electromagnetic waves irradiated by the display panel 200. For example, the first antenna 131 may receive the electromagnetic waves irradiated by the display panel 200 along the first direction D1.

The first antenna 131 may be disposed adjacent to the first side of the ground plate 120. The ground plate 120 includes a first corner formed by the first side and the second side. The first antenna 131 may be adjacent to the first corner of the ground plate 120.

The first antenna 131 may include a circuit board type antenna which includes an antenna pattern formed on a circuit board. Thus, the first antenna 131 may be mounted on the base substrate 110 adjacent to the first side of the ground plate 120.

The second antenna 132 may receive the electromagnetic waves irradiated by the display panel 200. For example, the second antenna 132 may receive the electromagnetic waves irradiated by the display panel 200 along the second direction D2.

The second antenna 132 may be disposed adjacent to the second side of the ground plate 120. The second antenna 132 may be adjacent to the first corner of the ground plate 120.

The second antenna 132 may include the circuit board type antenna. Thus, the second antenna 132 may be mounted on the base substrate 110 adjacent to the second side of the ground plate 120.

The third antenna 133 may receive the electromagnetic waves irradiated by the display panel 200. For example, the third antenna 133 may receive the electromagnetic waves irradiated by the display panel 200 along the third direction.

The third antenna 133 may be disposed adjacent to the third side of the ground plate 120. The ground plate 120 includes a second corner formed by the second side and the third side. The third antenna 133 may be adjacent to the second corner of the ground plate 120.

The third antenna 133 may include the circuit board type antenna. Thus, the third antenna 133 may be mounted on the base substrate 110 adjacent to the third side of the ground plate 120.

The fourth antenna 134 may receive the electromagnetic waves irradiated by the display panel 200. For example, the fourth antenna 134 may receive the electromagnetic waves irradiated by the display panel 200 along the second direction D2.

The fourth antenna 134 may be disposed adjacent to the second side of the ground plate 120. The fourth antenna 134 may be adjacent to the second corner of the ground plate 120.

The fourth antenna 134 may include the circuit board type antenna. Thus, the fourth antenna 134 may be mounted on the base substrate 110 adjacent to the second side of the ground plate 120.

The fifth antenna 135 may receive the electromagnetic waves irradiated by the display panel 200. For example, the fifth antenna 135 may receive the electromagnetic waves irradiated by the display panel 200 along the fourth direction.

The fifth antenna 135 may be disposed adjacent to the fourth side of the ground plate 120. The ground plate 120 includes a third corner formed by the first side and the fourth side. The fifth antenna 135 may be adjacent to the third corner of the ground plate 120.

The fifth antenna 135 may include the circuit board type antenna. Thus, the fifth antenna 135 may be mounted on the base substrate 110 adjacent to the fourth side of the ground plate 120.

The sixth antenna 136 may receive the electromagnetic waves irradiated by the display panel 200. For example, the sixth antenna 136 may receive the electromagnetic waves irradiated by the display panel 200 along the fourth direction.

The sixth antenna 136 may be disposed adjacent to the fourth side of the ground plate 120. The ground plate 120 includes a fourth corner formed by the third side and the fourth side. The sixth antenna 136 may be adjacent to the fourth corner of the ground plate 120.

The sixth antenna 136 may include the circuit board type antenna. Thus, the sixth antenna 136 may be mounted on the base substrate 110 adjacent to the fourth side of the ground plate 120.

The seventh antenna 137 may receive the electromagnetic waves irradiated by the display panel 200. For example, the seventh antenna 137 may receive the electromagnetic waves irradiated by the display panel 200 along the first direction D1.

The seventh antenna 137 may be disposed adjacent to the first side of the ground plate 120. The seventh antenna 137 may be adjacent to the third corner of the ground plate 120.

The seventh antenna 137 may include the circuit board type antenna. Thus, the seventh antenna 137 may be mounted on the base substrate 110 adjacent to the first side of the ground plate 120.

The eighth antenna 138 may receive the electromagnetic waves irradiated by the display panel 200. For example, the eighth antenna 138 may receive the electromagnetic waves irradiated by the display panel 200 along the third direction.

The eighth antenna 138 may be disposed adjacent to the third side of the ground plate 120. The eighth antenna 138 may be adjacent to the fourth corner of the ground plate 120.

The eighth antenna 138 may include the circuit board type antenna. Thus, the eighth antenna 138 may be mounted on the base substrate 110 adjacent to the third side of the ground plate 120.

The display panel 200 may be disposed on the fifth noise test apparatus 105. The display part of the display panel 200 may face the ground plate 120, and the first side of the display panel 200 may face the second direction D2.

In this exemplary embodiment, the panel test system may include the fifth noise test apparatus 105. The fifth noise test apparatus 105 may include the first to eighth antennas 131 to 138 adjacent to the wireless network device of display panel 200 which generates a noise.

The fifth noise test apparatus 105 may receive the electromagnetic waves irradiated by the display panel 200. Thus, the panel test system may analyze the noise of the display panel 200 based on the electromagnetic waves received by the fifth noise test apparatus 105.

According to one or more of the illustrated exemplary embodiments, the noise test apparatus may include a plurality of antennas corresponding to a position of the wireless network device. The EMI noise of the display panel may be analyzed during a manufacturing process of the display panel. In addition, the EMI noise of the wireless network device of the display panel may be analyzed during a manufacturing process of the display panel. Thus, the EMI noise of the display panel may be tested before the display panel is assembled into the end product.

The noise test apparatus of the illustrated exemplary embodiments may be applied to an method for testing a display panel of a mobile type display apparatus such as a tablet computer, a mobile phone and a laptop computer, a display panel of a fixed type display such as a television and a desktop display, and a display panel of a display apparatus of a general appliance such as a refrigerator, a washing machine and an air conditioner.

The foregoing is illustrative of the inventive concept and is not to be construed as limiting claims. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims.

What is claimed is:

1. A method for testing a display panel, the method comprising:
    driving the display panel;
    receiving electromagnetic waves irradiated by the display panel using a first noise test apparatus comprising a first antenna and a second antenna, wherein the first antenna is configured to receive the electromagnetic waves irradiated by the display panel along a first direction, and the second antenna is configured to receive the electromagnetic waves irradiated by the display panel along a second direction perpendicular to the first direction; and
    analyzing an electromagnetic interference noise of the display panel based on the electromagnetic waves,
    wherein the first noise test apparatus further comprises a first ground plate configured to support the display panel, the first ground plate comprising an insulating material, and
    wherein the first antenna is disposed on a base plate adjacent to a first side of the first ground plate and the second antenna is disposed on the base plate adjacent to a second side of the first ground plate.

2. The method of claim 1, further comprising receiving the electromagnetic waves by a second noise test apparatus comprising a third antenna and a fourth antenna, wherein the third antenna is configured to receive the electromagnetic waves irradiated by the display panel along a third direction opposite to the first direction, and the fourth antenna is configured to receive the electromagnetic waves irradiated by the display panel along the second direction.

3. The method of claim 2,
    wherein the second noise test apparatus further comprises a second ground plate configured to support the display panel, the second ground plate comprising an insulating material,
    wherein the third antenna is disposed on the base plate adjacent to a third side of the second ground plate, and
    wherein the fourth antenna is disposed on the base plate adjacent to a second side of the second ground plate.

4. The method of claim 3,
    wherein the first antenna is disposed on the base plate adjacent to a first corner of the first ground plate, which is formed by the first side and the second side of the first ground plate,
    wherein the second antenna is disposed on the base plate adjacent to the first corner of the first ground plate, wherein the third antenna is disposed on the base plate adjacent to a second corner of the second ground plate, which is formed by the second side and the third side of the second ground plate, and wherein the fourth antenna is disposed on the base plate adjacent to the second corner of the second ground plate.

5. A method for testing a display panel the method comprising:

driving the display panel;

receiving electromagnetic waves irradiated by the display panel using a first noise test apparatus comprising a first antenna, a second antenna, a third antenna and a fourth antenna, wherein the first antenna is configured to receive the electromagnetic waves irradiated by the display panel along a first direction, the second antenna is configured to receive the electromagnetic waves irradiated by the display panel along a second direction perpendicular to the first direction, the third antenna configured to receive the electromagnetic waves irradiated by the display panel along a third direction opposite to the first direction and the fourth antenna configured to receive the electromagnetic waves irradiated by the display panel along the second direction; and analyzing an electromagnetic interference noise of the display panel based on the electromagnetic waves, wherein the third antenna is disposed on a base plate adjacent to a third side of a first ground plate opposite to a first side of the first ground plate, and wherein the fourth antenna is disposed on the base plate adjacent to a second side of the first ground plate.

6. The method of claim 5, wherein the first antenna is disposed on the base plate adjacent to a first corner of the first ground plate, which is formed by the first side and the second side of the first ground plate, wherein the second antenna is disposed on the base plate adjacent to the first corner of the first ground plate, wherein the third antenna is disposed on the base plate adjacent to a second corner of the first ground plate, which is formed by the second side and the third side of the first ground plate, and wherein the fourth antenna is disposed on the base plate adjacent to the second corner of the first ground plate.

7. The method of claim 6, wherein the first noise test apparatus further comprises:

a fifth antenna configured to receive the electromagnetic waves irradiated by the display panel along a fourth direction opposite to the second direction;

a sixth antenna configured to receive the electromagnetic waves irradiated by the display panel along the fourth direction;

a seventh antenna configured to receive the electromagnetic waves irradiated by the display panel along the first direction; and an eighth antenna configured to receive the electromagnetic waves irradiated by the display panel along the third direction, wherein the fifth antenna is disposed on the base plate adjacent to a fourth side of the first ground plate opposite to the second side of the first ground plate, the fifth antenna being disposed on the base plate adjacent to a third corner of the first ground plate, which is formed by the first side and the fourth side of the first ground plate, wherein the sixth antenna is disposed on the base plate adjacent to the fourth side of the first ground plate, the sixth antenna being disposed on the base plate adjacent to a fourth corner of the first ground plate, which is formed by the third side and the fourth side of the first ground plate, wherein the seventh antenna is disposed on the base plate adjacent to the first side of the first ground plate, the seventh antenna being disposed on the base plate adjacent to the third corner of the first ground plate, and wherein the eighth antenna is disposed on the base plate adjacent to the third side of the first ground plate, the eighth antenna being disposed on the base plate adjacent to the fourth corner of the first ground plate.

8. The method of claim 5, wherein the first noise test apparatus further comprises:

a fifth antenna configured to receive the electromagnetic waves irradiated by the display panel along a fourth direction opposite to the second direction; and a sixth antenna configured to receive the electromagnetic waves irradiated by the display panel along the fourth direction, wherein the fifth antenna and the sixth antenna are disposed adjacent to a fourth side of the first ground plate, wherein the first antenna is adjacent to a center of the first side of the first ground plate, and wherein the third antenna is adjacent to a center of the third side of the first ground plate.

9. A method for testing a display panel, the method comprising:

driving the display panel;

receiving electromagnetic waves irradiated by the display panel using a first noise test apparatus comprising a first antenna and a second antenna, wherein the first antenna is configured to receive the electromagnetic waves irradiated by the display panel along a first direction, and the second antenna is configured to receive the electromagnetic waves irradiated by the display panel along a second direction perpendicular to the first direction; and analyzing an electromagnetic interference noise of the display panel based on the electromagnetic waves, wherein the display panel comprises a display part configured to display an image and a wireless network device, wherein the driving the display panel comprises driving the display part and driving the wireless network device, wherein the first noise test apparatus further comprises a first ground plate configured to support the display panel, the first ground plate comprising an insulating material, wherein the first antenna is disposed on a base plate adjacent to a first side of the first ground plate and the second antenna is disposed on the base plate adjacent to a second side of the first ground plate, and wherein the wireless network device is parallel with and adjacent to the first side of the display panel.

* * * * *